US011390951B2

United States Patent
Hidaka et al.

(10) Patent No.: US 11,390,951 B2
(45) Date of Patent: Jul. 19, 2022

(54) FLUID CONTROL DEVICE

(71) Applicant: FUJIKIN INCORPORATED, Osaka (JP)

(72) Inventors: Atsushi Hidaka, Osaka (JP); Takatoshi Nakatani, Osaka (JP); Keisuke Nakatsuji, Osaka (JP); Keiji Hirao, Osaka (JP); Yukio Minami, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 280 days.

(21) Appl. No.: 16/634,033

(22) PCT Filed: Jul. 20, 2018

(86) PCT No.: PCT/JP2018/027234
§ 371 (c)(1),
(2) Date: Jan. 24, 2020

(87) PCT Pub. No.: WO2019/021949
PCT Pub. Date: Jan. 31, 2019

(65) Prior Publication Data
US 2020/0199753 A1 Jun. 25, 2020

(30) Foreign Application Priority Data
Jul. 25, 2017 (JP) .............................. JP2017-144027

(51) Int. Cl.
*H01L 21/67* (2006.01)
*C23C 16/52* (2006.01)
*H01L 21/31* (2006.01)

(52) U.S. Cl.
CPC .............. *C23C 16/52* (2013.01); *H01L 21/31* (2013.01); *H01L 21/67017* (2013.01)

(58) Field of Classification Search
CPC ............. F16K 49/002; Y10T 137/6606; H01L 21/67017; C23C 16/45561
See application file for complete search history.

(56) References Cited

U.S. PATENT DOCUMENTS 6,014,498 A * 1/2000 Ikeda ...................... F16K 49/00
219/520
6,195,504 B1 2/2001 Horie et al.
(Continued)

FOREIGN PATENT DOCUMENTS

CN 105716225 A 6/2016
JP H11-87327 A 3/1999
(Continued)

OTHER PUBLICATIONS

International Search Report issued in PCT/JP2018/027234; dated Aug. 28, 2018.

*Primary Examiner* — Kevin F Murphy
(74) *Attorney, Agent, or Firm* — Studebaker & Brackett PC

(57) ABSTRACT

In order to appropriately control temperatures of fluid heating sections that are maintained at different temperatures, the fluid control device (100) comprises a plurality of fluid heating sections (1) connected to each other and each having a flow path or a fluid accommodating portion inside, heaters (10) configured to heat each of the plurality of fluid heating sections to different temperatures, and heat insulating members (13, 13') disposed between adjacent fluid heating sections.

10 Claims, 3 Drawing Sheets

(56) References Cited

U.S. PATENT DOCUMENTS

| | | | |
|---|---|---|---|
| 7,677,265 B2* | 3/2010 | Shikata | F16K 27/003 137/341 |
| 7,726,333 B2* | 6/2010 | Hoshi | F24H 9/1863 137/341 |
| 7,849,873 B2* | 12/2010 | Hiratsuka | F16K 49/00 137/341 |
| 8,931,506 B2* | 1/2015 | Nagata | F02M 21/06 137/341 |
| 9,096,931 B2* | 8/2015 | Yednak, III | C23C 16/45561 |
| 2004/0204794 A1* | 10/2004 | Ohmi | G05D 7/0635 700/282 |
| 2015/0322567 A1 | 11/2015 | Hidaka et al. | |
| 2016/0178235 A1 | 6/2016 | Taguchi et al. | |
| 2018/0071702 A1 | 3/2018 | Hidaka et al. | |

FOREIGN PATENT DOCUMENTS

| | | |
|---|---|---|
| JP | 2014114463 A | 6/2014 |
| WO | 2016174832 A1 | 11/2016 |

* cited by examiner (a)

(b)

FLUID CONTROL DEVICE

TECHNICAL FIELD

The present invention relates to a fluid control device for use in a semiconductor manufacturing device, a chemical plant, or the like, and more particularly, to a fluid control device including a plurality of fluid heating sections maintained at different temperatures.

BACKGROUND OF INVENTION

Conventionally, in a semiconductor manufacturing device for a film deposition by, metal organic chemical vapor deposition (MOCVD), for example, a raw material vaporization supply device for supplying a raw material gas to a process chamber has been used (for example, Patent Document 1).

In some raw material vaporization supply devices, an organometallic liquid raw material such as TEOS (Tetraethyl orthosilicate) is stored in a storage tank, pressurized inert gas is supplied to the storage tank, and the liquid raw material is extruded at a constant pressure and supplied to a vaporizer. The supplied liquid raw material is vaporized by a heater disposed around the vaporizer, and the vaporized gas is controlled to a predetermined flow rate by a flow rate control device and supplied to the semiconductor manufacturing device.

Some organometallic materials as raw materials have boiling points exceeding 150° C., for example, the boiling point of the above TEOS is about 169° C. Therefore, the raw material vaporization supply device is configured to be able to heat the liquid raw material to a relatively high temperature, for example, to a temperature of 200° C. or higher.

In addition, in order to prevent condensation (re-devolatilization) of the vaporized raw material, the raw material vaporization supply device is required to supply gas to the process chamber through a flow path heated to a high temperature. Moreover, in order to efficiently vaporize the organometallic material, the liquid raw material may be heated in advance before being supplied to the vaporizer. Thus, in the raw material vaporization supply device, heaters are disposed at necessary positions for heating fluid heating sections (e.g., a vaporizer) each provided with a flow path or a fluid accommodating portion to a high temperature.

Patent Document 2 discloses a vaporization supply device including a preheating section for preheating a raw material liquid, a vaporizer for vaporizing the raw material liquid heated by the preheating section, and a high-temperature compatible pressure type flow rate control device for controlling a flow rate of the vaporized gas. In the vaporization supply device described in Patent Document 2, jacket heaters are used as means for heating the main body of the vaporizer, the flow path, and the like.

PRIOR-ART DOCUMENT

Patent Documents

Patent Document 1: Japanese Laid-Open Patent Publication No. 2014-114463
Patent Document 2: International Patent Publication No. WO2016/174832

SUMMARY OF INVENTION

Problems to be Solved by Invention

In the above-mentioned raw material vaporization and supply device, the preheating section provided for preheating the raw material is maintained at a temperature equal to or lower than the boiling point of the raw material, for example, and the vaporizing section is maintained at a temperature equal to or higher than the boiling point of the raw material, for example. However, since the boiling point of a fluid fluctuates depending on the pressure of the fluid, the liquid state may be maintained without evaporation depending on the pressure of the raw material even if the temperature of the preheating section becomes equal to or higher than the boiling point of the raw material at the normal pressure (atmospheric pressure). When a raw material having a thermal decomposition temperature lower than the boiling point is used, the vaporizing section may be set to a temperature equal to or lower than the boiling point. Note that the set temperature of the vaporizing section is usually set higher than the set temperature of the preheating section. Further, the pressure type flow rate control device for controlling the flow rate of the vaporized raw material is maintained at a temperature equal to or higher than the boiling point of the raw material, typically higher than the temperature of the vaporizing section.

However, in the conventional raw material vaporization supply device, it is not easy to control each fluid heating section to a different temperature. Thus, for example, when the temperature of the preheating section becomes higher than necessary, the raw material may be vaporized inside the preheating section, and the supply of liquid with a high-temperature to the vaporization section may not be appropriately performed.

The present invention has been made in view of the above-mentioned problems, and a main object is to provide a fluid control device capable of appropriately heating a plurality of fluid heating sections.

Means for Solving Problems

A fluid control device according to one embodiment of the present invention includes a plurality of fluid heating sections each provided with a flow path or a fluid accommodation portion inside and connected to each other, heaters configured to heat each of the plurality of fluid heating sections to different temperatures, and a heat insulating member disposed between adjacent fluid heating sections.

In one embodiment, the plurality of fluid heating sections includes a vaporizing section, a preheating section for preheating a liquid supplied to the vaporizing section, and a flow control measurement section for controlling or measuring a gas delivered from the vaporizing section, a heat insulating member being arranged between the adjacent vaporizing sections and the preheating sections.

In one embodiment, the fluid control device further includes a stop valve provided downstream side of the flow control measurement section, and an insulating member is further provided between the valve downstream path of the stop valve and the valve upstream path of the stop valve.

In one embodiment, the heaters include a first heater for heating the preheating section, a second heater for heating the vaporizing section, and a third heater for heating the flow control measurement section, the preheating section, the vaporizing section and the flow control measurement section are structured to heat independently respectively.

In one embodiment, a gap is provided between the first heater and the second heater, the insulating member is provided at a position of the gap between the first and the second heater.

Effect of Invention

According to the fluid control device related to the embodiments of the present invention, each of the plurality of fluid heating sections is easily maintained at a different appropriate temperature, thereby improving the controllability of fluid.

DETAILED DESCRIPTION OF INVENTION

Embodiments of the present invention will be described below with reference to the drawings, but the present invention is not limited to the following embodiments.

Figure 1:
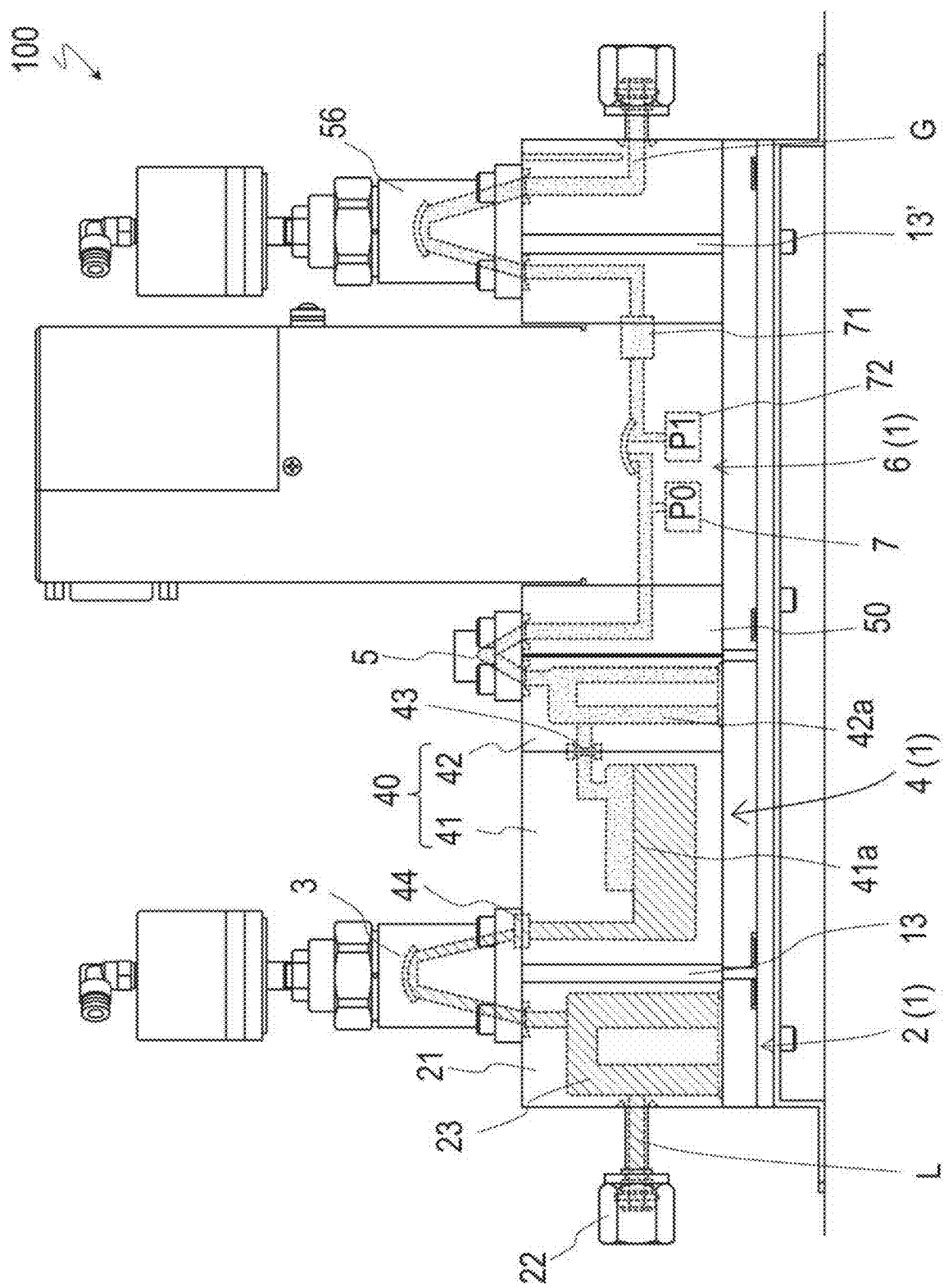
FIG. 1 is a schematic diagram showing a fluid control device according to an embodiment of the present invention.

FIG. 1 illustrates a fluid control device 100 according to an embodiment of the present invention. The fluid control device 100 includes a vaporizing section 4 for generating a raw material gas G used in a semiconductor manufacturing device or the like, a preheating section 2 for preheating a liquid raw material L supplied to the vaporizing section 4, and a fluid control measurement section 6 for controlling or measuring the gas G delivered from the vaporizing section 4. In FIG. 1, a portion filled with the liquid raw material L is indicated by hatching with diagonal lines, and a portion where the gas G flows is indicated by hatching with dots.

Each of the preheating section 2, the vaporizing section 4, and the fluid control measurement section 6 is provided as a fluid heating section 1 in which an internal fluid (liquid raw material L or gas G) is heated, and a flow path or a fluid accommodating portion is provided in each of the preheating section 2, the vaporizing section 4, and the fluid control measurement section 6. These components are heated from the outside by heaters 10, which will be described later.

In the fluid control device 100, the vaporizing section 4 can control a liquid filling valve 3 to supply the raw material L via the liquid filling valve 3. In addition, by providing a liquid detecting section (not shown) for detecting an amount of the liquid raw material L exceeding a predetermined amount being supplied in the vaporizing section 4, and closing the liquid filling valve 3 when the liquid detecting section detects a liquid, oversupply of the liquid raw material L to the vaporizing section 4 can be prevented. As the liquid detection section, as described in Patent Document 2, a thermometer (platinum resistance temperature detector, thermocouple, thermistor, etc.), a level gauge, a load cell, etc. disposed in the vaporization chamber can be used.

In the present embodiment, the fluid control measurement section 6 is a known high-temperature compatible type pressure type flow rate control device, and as described later, the flow rate of the gas flowing through an orifice member 71 can be controlled by adjusting the upstream pressure P1 of the orifice member 71 using a control valve.

However, the fluid control measurement section 6 is not limited to a pressure type flow rate control device and may be a flow rate control device of various modes. The fluid control measurement section 6 may be a fluid measurement section including a flow rate sensor, a concentration sensor, and the like. Hereinafter, the fluid control measurement section 6, which is a pressure type flow rate control device, may be referred as the fluid control section 6.

The fluid control device 100 according to the present embodiment includes a first heater 12 for heating the preheating section 2, a second heater 14 for heating the vaporizing section 4, and a third heater 16 for heating the fluid control section 6, as heaters 10 for heating the fluid heating section 1 (here, the preheating section 2, the vaporizing section 4, and the fluid control section 6).

Figure 2:
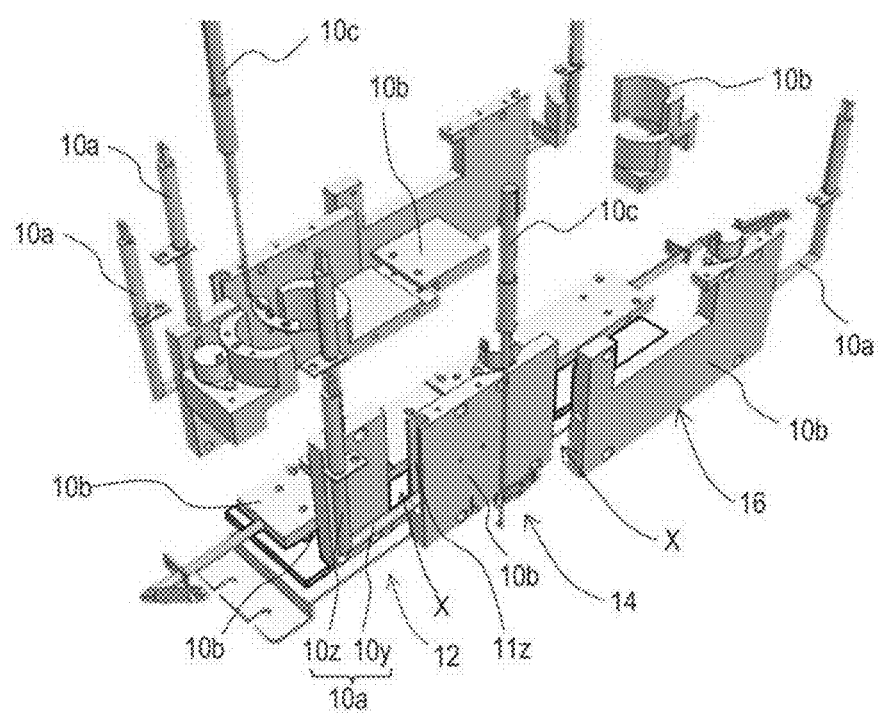
FIGS. 2 (a) and (b) are exploded perspective views of the heater, and show respectively when viewed from above and from below diagonally
Figure 2:
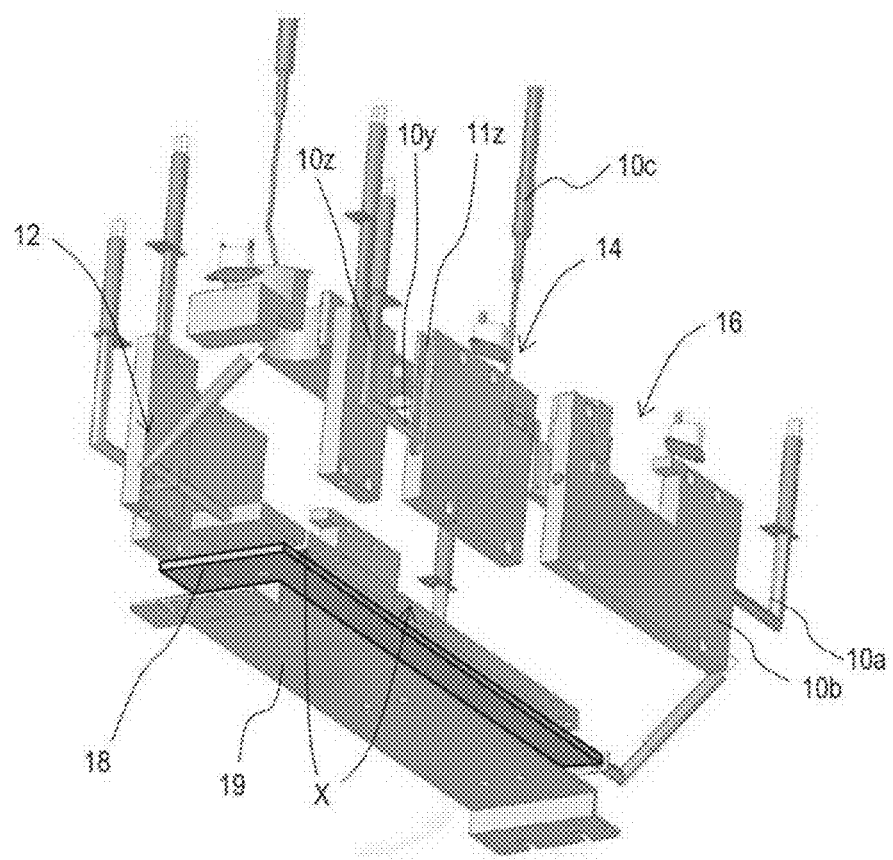

FIGS. 2(a) and 2 (b) are exploded perspective views of the heater 10 (the first heater 12, the second heater 14, and the third heater 16) as viewed from different angles. As shown in FIGS. 2(a) and 2 (b), each of the heaters 10 includes a heating element 10a and a metallic heat transfer member 10b thermally connected to the heating element 10a.

The heat generated by the heating element 10a is conducted to the whole of the heat transfer member 10b, and the whole heat transfer member 10b is heated by the heating element 10a. The uniformly heated heat transfer member 10b can uniformly heat the fluid heating section 1 from outside. The heat transfer member 10b is configured by connecting parts made of aluminum by screwing or the like, and is provided so as to surround the fluid heating section 1 inside by, for example, fixing the bottom plate part, the pair of side wall parts, and the upper surface part in combination.

As the fluid control device 100 used in the semiconductor manufacturing device, it is preferable to select aluminum or an aluminum alloy as the material of the heat transfer member 10b because there is little concern of contamination to the process and it is relatively inexpensive. However, in other applications, other high thermal conductivity metal materials such as those described above may be used.

The heating element 10a of heaters 10 is inserted into and fixed to an elongated hole provided in the side wall portion of the heat transfer member 10b. The heating element 10a and the heat transfer member 10b are thermally connected and fixed so that heat from the heating element 10a is efficiently transferred to the heat transfer member 10b. In a preferred embodiment, the heating element 10a is fixed in close contact with an elongated hole provided in the heat transfer member 10b, and may be fixed to the heat transfer member 10b via a known heat conductive material (such as heat conductive grease or heat conductive sheet) applied to the outside of the heating element 10a.

In the example shown in FIG. 2, in the first heater 12, a rod-shaped cartridge heater 10a is inserted into an elongated hole extending in the vertical direction downward from an upper end surface of an side wall portion of the heat transfer member 10b, and in the second heater 14 and the third heater 16, the heating element 10a inflected in the L-shape is inserted into an elongated hole extending in the horizontal direction in which an opening is provided in a lateral end surface of a side wall portion of the heat transfer member 10b. However, as the heating element 10a, various known heating devices can be used, and for example, a planar heater fixed to the heat transfer member 10b may be used.

In addition, a horizontal direction portion 10y of the heating element 10a inflected in the L-shape is accommodated in an elongated hole of the heat transfer member 10b, but the vertical direction portion 10z is not inserted into an elongated hole, thus may interfere with the connection between the heat transfer members 10b. In such a case, a concave portion 11z in which the vertical direction portion 10z can be accommodated is formed in advance in an end portion of the heat transfer member 10b, and when the horizontal direction portion 10y of the heating element 10a is inserted into the elongated hole, the vertical direction portion 10z can be accommodated in the concave portion 11z so as to avoid disconnection between heat transfer members 10b.

Further, in the example shown in FIG. 2, a temperature sensor 10c attached to a second heater 14 (a heater for heating the vaporizing section 4) is shown, and the temperature of the heat transfer member 10b of the second heater 14 can be directly measured.

The temperature of the first heater 12 is set to, for example, about 180° C., the temperature of the second heater 14 is set to, for example, about 200° C., and the temperature of the third heater 16 is set to, for example, about 210° C. Normally, the first heater 12 for heating the preheating section 2 is set to a temperature lower than that of the second heater 14 for heating the vaporizing section 4, and the third heater 16 for heating the fluid control section 6 is set to a temperature higher than that of the second heater 14. As described above, in the present embodiment, since the temperature of each heater can be individually controlled by using a control device (not shown), the vaporization of the raw material, the preheating of the liquid raw material, and the prevention of the re-devolatilization of the vaporized raw material can be carried out at appropriate temperatures, respectively.

In addition, the upper surface portion of the heat transfer member 10b may have any shape corresponding to the shape of an upper mounting member such as a valve or a pressure sensor mounted thereon. As a result, heat transfer to the fluid heating section 1 can be performed, and it can also be appropriately used as a support member of the upper mounting member. As shown in FIG. 2(b), a bottom plate portion of the heat transfer member 10b may be attached to a common support 19 via a heat insulating member 18 made of resin (e.g., PEEK (Poly Ether Ether Ketone). The heat insulating member 18 may be made of any material as long as heat can be insulated, and any material may be appropriately selected in accordance with the temperature.

In the present embodiment, gaps X are provided between the heat transfer member 10b of the first heater 12 and the heat transfer member 10b of the second heater 14, also between the heat transfer member 10b of the second heater 14 and the heat transfer member 10b of the third heater 16, respectively. As a result, even when the preheating section 2, the vaporizing section 4, and the fluid control section 6 are individually heated by using the heaters 12, 14, and 16, since the thermal conductivity between the heaters is lowered, the advantage of easy temperature control to desired temperatures can be achieved.

Moreover, as shown in FIG. 1, a heat insulating member 13 is provided between the first heater 12 and the second heater 14, at a position corresponding to the gap X provided between the first heater 12 and the second heater 14. The heat insulating member 13 is provided at a position between the fluid inlet of the liquid filling valve 3 and the fluid outlet of the liquid filling valve 3 so as to be covered by the liquid filling valve 3 which connect the preheating section 2 and the vaporizing section 4.

In the present embodiment, a panel material made of PEEK is used as the heat insulating member 13. The thickness of the heat insulating member 13 may be appropriately selected according to the required heat insulating property, but may be, for example, about 0.5 mm to 50 mm Between the first heater 12 and the second heater 14, the heat insulating member 13 may be sandwiched and fixed between the preheating section 2 and the vaporizing section 4 or may be fixed using a jig. Although the shape of the heat insulating member 13 may be arbitrary, but in order to appropriately prevent the heat of the vaporizing portion 4 from being conducted to the preheating portion 2, it is preferable to have a shape that prevents direct or indirect connection between the preheating portion 2 and the vaporizing portion 4.

Further, the heat insulating member 13 is not limited to be made of the above-mentioned PEEK and may be formed of any material as long as heat can be insulated, and a material or the like may be appropriately selected in accordance with temperatures. A well-known vacuum heat insulating panel or the like can also be used as the heat insulating member 13.

In the configuration described above, since the first heater 12 and the second heater 14 are separated from each other by the heat insulating member 13, heat conduction from the second heater 14 and the vaporizing portion 4 to the preheating portion 2 is suppressed. Therefore, the preheating section 2 can be prevented from becoming too high a temperature exceeding the set temperature, (for example, a temperature exceeding the boiling point or the pyrolysis temperature of the liquid raw material), by the heat from the second heater 14 set at a temperature of 200° C. or more, for example, thereby the raw material liquid can be prevented from being vaporized before being sent to the vaporizing section 4.

In the fluid control device 100 of the present embodiment, a further heat insulating member 13' is also disposed downstream side of the fluid control section 6 (in the vicinity of a stop valve 56). More specifically, the downstream side heat insulating member 13' is provided between the valve downstream side flow path of the stop valve 56 and the valve upstream side flow path of the stop valve 56. The heat insulating member 13' may also be formed of any material or shape as long as heat can be insulated, and any material may be appropriately selected according to the temperature. By providing the heat insulating member 13', it is possible to obtain advantages that the heat transfer to the outside is suppressed and the fluid control section 6 is easily maintained at a high temperature. As the stop valve 56, for example, a well-known air operated valve or electromagnetic valve can be used, and gas flow can be shut off as necessary.

On the other hand, there is no heat insulating member provided between the vaporizing section 4 and the fluid control section 6. This is because even if the temperature of the vaporizing section 4 becomes slightly higher than the set temperature by the heat from the higher-temperature fluid control section 6, there is no problem, and rather, the vaporizing section 4 can efficiently perform vaporization.

As described above, in the fluid control device 100, in a mode in which a plurality of fluid heating sections (the preheating section 2, the vaporizing section 4, and the fluid control section 6) controlled to different temperatures are connected, by selectively providing a heat insulating member at a position where heat conduction need to be suppressed, it is possible to appropriately control the fluid while improving the energy utilization efficiency.

In the heater 10 of the present embodiment, the inner surface of the heat transfer member 10b made of aluminum, that is, the surface facing the fluid heating section 1 may be subjected to anodization as a surface treatment for improving heat dissipation, and the outer surface of the heat transfer member 10b may be a polished surface or a mirror-processed surface. The mirror surface on the outer side of the heat transfer member 10b is typically formed by a polishing but may be formed only by scraping.

The inner surface of the heat transfer member 10b is anodized (for example, hard anodized) to improve heat dissipation, heat from the heating element 10a can be conducted directly from the heat transfer member 10b to the fluid heating section 1 when in contact, and can be conducted to the liquid heating section 1 uniformly and with improved efficiency by high emissivity (high radiant heat) even when the heat transfer member 10b and the fluid heating section 1 are at a distance from each other. In addition, in the case where the fluid heating section 1 is in contact with the heat transfer member 10b, heat is conducted from the contact portion, but when heat is transferred from the heat transfer member 10b to the fluid heating section 1, if the inner surface of the heat transfer member 10b is not subjected to alumite treatment, heat is reflected on the inner surface of the heat transfer member 10b due to the emissivity, and there is heat that does not transfer to the fluid heating section 1. On the other hand, when the inner surface of the heat transfer member 10b is anodized as in the present embodiment, since the emissivity is high, there is almost no heat reflected by the surface in contact with the fluid heating section 1, and almost all of the heat from the heat transfer member 10b is conducted to the fluid heating section 1.

Further, heat dissipation to the outside of the heater 10 can be suppressed by mirror-finishing the outside surface of the heat transfer member 10b. As a result, an advantage of energy saving can be achieved. In addition, the present invention is not limited to the hard anodizing, and the same effect can be exhibited even in the normal anodizing. The thickness of the alumite layer exhibits the same effect as long as the thickness is for example 1 μm or more, that is formed by normal anodization. However, the hard anodizing is advantageous in that scratches are hardly generated during operation, and a concern that the film may be peeled off can be reduced compared with the normal anodization.

Hereinafter, with reference to FIG. 1 for example, a more specific configuration of the fluid control device 100 of the present embodiment will be described in detail.

The vaporizing section 4 includes a main body 40 formed by connecting a vaporizing block 41 made of stainless steel and a gas heating block 42. The vaporizer block body 41 has a liquid supply port formed in an upper portion thereof, and a vaporization chamber 41a formed therein. In the gas heating block 42, a gas heating chamber 42a communicating with a gas flow path extending from the upper portion of the vaporization chamber 41a is formed, and a gas discharge port is formed in the upper portion. The gas heating chamber 42a has a structure in which a columnar heating accelerator is installed in a cylindrical space, and a gap between the cylindrical space and the heating accelerator is a gas flow path. A gasket 43 with a through hole is interposed in the gas communication portion between the vaporizing block 41 and the gas heating block 42, and gas pulsation is prevented when the gas passes through the through hole of the gasket 43.

The preheating section 2 includes a preheating block 21 connected to the vaporizing block 41 of the vaporizing section 4 via a liquid filling valve 3. A liquid storage chamber 23 is formed inside the preheating block 21. The liquid storage chamber 23 communicates with a liquid inflow port 22 provided on a side surface and a liquid outflow port provided on the upper surface. The preheating block 21, both stored in the liquid raw material L to be pumped at a predetermined pressure from a liquid storage tank not shown to the liquid storage chamber 23, preheating by using the first heater 12 before supplying to the vaporizing chamber 41a. And a columnar heating accelerator for increasing the surface area is also disposed in the liquid storage chamber 23.

The liquid filling valve 3 controls the supply amount of the liquid raw material L to the vaporizing section 4 by opening and closing or adjusting the opening degree of a supply passage communicating with the preheating block 21 and the vaporizing block 41 using a valve mechanism. As the liquid filling valve 3, for example, an air operated valve can be used. A gasket 44 having a narrow hole is interposed in the liquid supply port of the vaporizing block 41, and the supply amount into the vaporizing chamber 41a is adjusted by passing the liquid raw material through the narrow hole of the gasket 44.

In the present embodiment, the fluid control section 6 is a high-temperature compatible pressure type control device, and may have, for example, the configuration described in Patent Document 2. The high-temperature compatible type pressure type control device includes, for example, a valve block as a main body provided with a gas flow path inside, a metal diaphragm valve element interposed in the gas flow path, a heat dissipation spacer and a piezoelectric driven element arranged in the longitudinal direction, an orifice member (such as an orifice plate) interposed in the gas flow path downstream side of the metal diaphragm valve element, and formed with a narrow hole, and a flow rate control pressure detector for detecting the pressure in the gas flow path between the metal diaphragm valve element and the orifice member. The heat dissipation spacer is formed of an invar material or the like, and prevents the piezoelectric driven element from becoming a heat-resistant temperature or higher even if a high-temperature gas flows through the gas flow path. The high-temperature correspondence type pressure type control device is configured such that, when the piezoelectric driven element is not energized, the metal diaphragm valve element abuts against the valve seat to close the gas flow path, while the piezoelectric driven element is energized and expanded, the metal diaphragm valve element returns to the original inverted dish shape by the self-elastic force, and opens the gas flow path.

Figure 3:
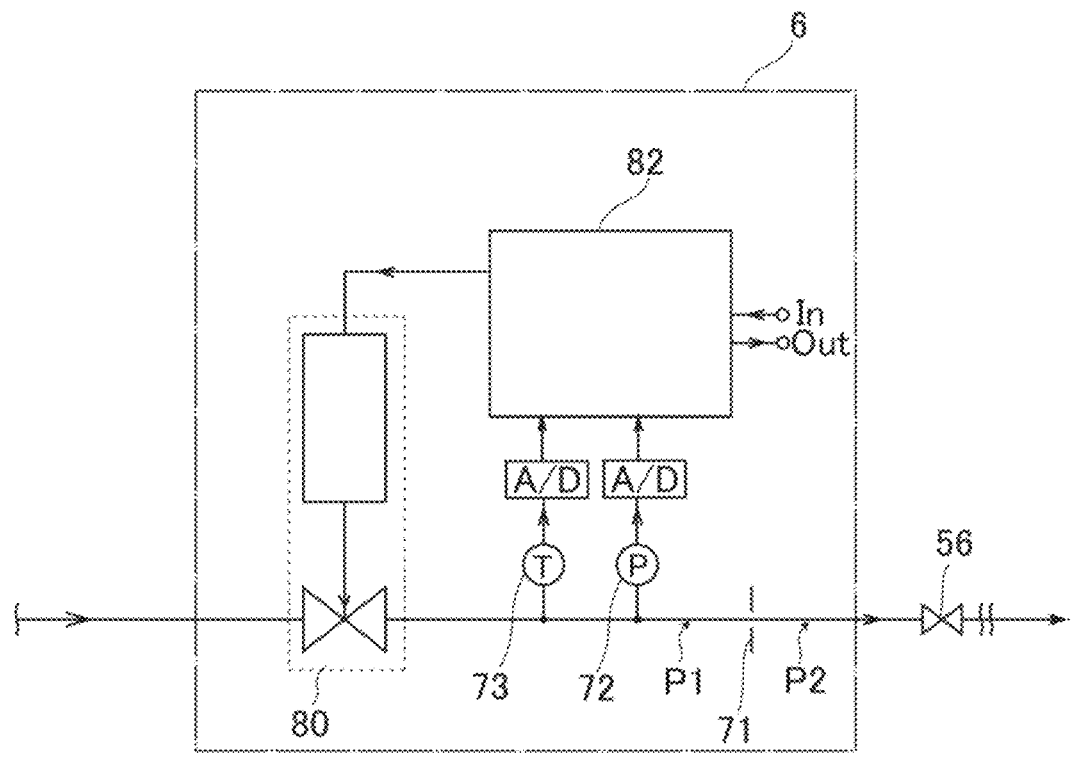
FIG. 3 is a schematic diagram showing a configuration example of a fluid control section according to an embodiment of the present invention.

FIG. 3 is a diagram schematically showing an example of the configuration of the fluid control section 6 (a pressure type flow control device). The pressure type flow control device 6 includes an orifice member 71, a control valve 80 comprising a metal diaphragm valve element and a piezoelectric driven element, a pressure detector 72 and a temperature detector 73 provided between the orifice member 71 and the control valve 80. The orifice member 71 is provided as a restriction part, and a critical nozzle or a sonic nozzle may be used instead. The aperture diameter of the orifice or the nozzle is set to, for example, 10 μm to ~500 μm.

The pressure detector 72 and the temperature detector 73 are connected to a control circuit 82 via an A/D converter. The AD converter may be incorporated in the control circuit 82. The control circuit 82 is also connected to the control valve 80, generates a control signal based on outputs of the pressure detector 72 and the temperature detector 73, and controls the operation of the control valve 80 by this control signal.

The pressure type flow control device 6 can perform a flow rate control same as that of a conventional one, and can control the flow rate based on the upstream pressure P1 (pressure upstream side of the orifice member 71) using the pressure detector 72. In another embodiment, the pressure type flow control device 6 may also include a pressure detector downstream of the orifice member 71 and may be configured to detect the flow rate based on the upstream pressure P1 and the downstream pressure P2.

In the pressure type flow control device 6, when the critical expansion condition P1/P2≥about 2 (P1: gas pressure (upstream pressure) upstream side of the restriction part, P2: gas pressure (downstream pressure) downstream side of the restriction part, and about 2 is for nitrogen gas) is satisfied, the flow rate of the gas passing through the restriction part is fixed to the sonic velocity, and the flow rate is determined by the upstream pressure P1 regardless of the downstream pressure P2. When the critical expansion condition is satisfied, the flow rate Q downstream of the restriction part is given by Q=$K_1$*P1, where $K_1$ is a constant depending on the fluid type and the fluid temperature, and the flow rate Q is proportional to the upstream pressure P1. When the downstream pressure sensor is provided, the flow rate can be calculated even when the difference between the upstream pressure P1 and the downstream pressure P2 is small and the critical expansion condition is not satisfied, on the basis of the upstream pressure P1 and the downstream pressure P2 measured by the pressure sensors, the flow rate Q can be calculated from a predetermined equation Q=$K_2$*$P2^m$ (P1−P2)$^n$ (where $K_2$ is a constant depending on the fluid type and the fluid temperature, m and n are exponents derived based on the actual flow rate).

A control circuit 82 obtains the flow rate from the above Q=$K_1$*P1 or Q=$K_2$*$P2^m$ (P1−P2)$^n$ by calculation based on the output (upstream pressure P1) of the pressure detector 72 or the like, and feedback-controls the control valve 80 so that the flow rate approaches the set flow rate input by a user. The flow rate obtained by the calculation may be displayed as a flow rate output value.

In the fluid control device 100 of the present embodiment, as shown in FIG. 1, the spacer block 50 is connected to the gas heating block 42, and the valve block of the fluid control device 6 is connected to the spacer block 50. A gas flow path in the flow path block 5 fixed so as to straddle the gas heating block 42 and the spacer block 50 communicates the gas heating chamber 42a of the gas heating block 42 with the gas flow path of the spacer block 50. The gas flow path of the spacer block 50 is in communication with the gas flow path of the valve block of the fluid control device 6. In addition, the downstream side of the stop valve 56 is connected to, for example, a process chamber of a semiconductor manufacturing device, and when gas is supplied, the inside of the process chamber is depressurized by a vacuum pump, and a raw material gas at a predetermined flow rate is supplied to the process chamber.

INDUSTRIAL APPLICABILITY

The fluid control device according to the embodiments of the present disclosure can be used, for example, for supplying a raw material gas to a processing chamber in a MOCVD semiconductor manufacturing device.

DESCRIPTION OF NUMERICALS

1 Fluid heating section
2 Preheating section
3 Liquid filling valve
4 Vaporizing section
5 Flow path block
6 Fluid control section
10 Heaters
13, 13' Heat insulating member
56 Stop valve
100 Fluid control device

The invention claimed is:

1. A fluid control device comprising:
a plurality of fluid heating sections connected to each other and each provided with a flow path or a fluid accommodation portion inside, the plurality of fluid heating sections including a vaporizing section, a preheating section disposed adjacent to the vaporizing section for preheating a liquid to be supplied to the vaporizing section, and a fluid control measurement section disposed adjacent to the vaporizing section for controlling or measuring a gas delivered from the vaporizing section;
heaters each configured to heat each of the plurality of fluid heating sections to different temperatures;
a heat insulating member disposed between the preheating section and the vaporizing section;
a stop valve provided downstream of the fluid control measurement section; and
a further heat insulating member provided outside the stop valve and disposed between a valve downstream flow path of the stop valve and a valve upstream flow path of the stop valve;
wherein the heaters are configured to heat corresponding fluid heating sections from outside.

2. The fluid control device according to claim 1, wherein the heaters include a first heater disposed at a distance from the preheating section for heating the preheating section from outside; a second heater disposed at a distance from the vaporizing section for heating the vaporizing section from outside; and a third heater disposed at a distance from the fluid control measurement section for heating the fluid control measurement section from outside; and the first, second, and third heaters are configured to independently heat the preheating section, the vaporizing section, and the fluid control measurement section respectively.

3. The fluid control device according to claim 2, wherein a gap is provided between the first heater and the second heater, and the heat insulating member is provided at a position of the gap between the first heater and the second heater.

4. The fluid control device according to claim 1, wherein the further heat insulating member is disposed so as to be straddled by the stop valve.

5. The fluid control device according to claim 1, further comprising a liquid filling valve provided in a flow path between the preheating section and the vaporizing section, wherein the heat insulating member is disposed so as to be straddled by the liquid filling valve.

6. The fluid control device according to claim 1, wherein there is no heat insulating member between the vaporizing section and the fluid control measurement section.

7. The fluid control device according to claim 1, wherein each of the heaters comprises a heating element and a heat transfer member thermally connected to the heating element, and each heating element includes a rod shaped cartridge heater inserted into an elongated hole formed in the corresponding heat transfer member.

8. The fluid control device according to claim 1, wherein each of the heaters includes a heating element and a heat transfer member thermally connected to the heating element, and each heat transfer member has an inner surface facing the corresponding heating section, the inner surface being treated for improving heat dissipation.

9. The fluid control device according to claim 8, wherein each heat transfer member comprises an aluminum or an aluminum alloy, and the inner surface of the heat transfer member includes an anodized surface.

10. The fluid control device according to claim 9, wherein each heat transfer member has an outer surface located opposite side of the inner surface, and the outer surface includes a polished surface or a mirror finished surface.

\* \* \* \* \*